United States Patent [19]
Dhote et al.

[11] Patent Number: 5,798,903
[45] Date of Patent: Aug. 25, 1998

[54] ELECTRODE STRUCTURE FOR FERROELECTRIC CAPACITOR INTEGRATED ON SILICON

[75] Inventors: Anil M. Dhote, College Park; Ramamoorthy Ramesh, Burtonsville, both of Md.

[73] Assignees: Bell Communications Research, Inc., Morristown, N.J.; University of Maryland, College Park, Md.

[21] Appl. No.: 578,499

[22] Filed: Dec. 26, 1995

[51] Int. Cl.$^6$ ..................................................... H01G 4/06
[52] U.S. Cl. ................... 361/321.4; 361/312; 361/321.5; 257/295; 257/306; 257/310
[58] Field of Search ................................ 361/311–313, 320, 361/321.1, 321.2, 321.3, 321.4, 321.5; 29/25.42; 438/393, 396; 257/295–296, 306–311

[56] References Cited

U.S. PATENT DOCUMENTS

| | | | |
|---|---|---|---|
| 5,248,564 | 9/1993 | Ramesh | 428/688 |
| 5,262,920 | 11/1993 | Sakuma et al. | 361/321.5 |
| 5,293,510 | 3/1994 | Takenaka | 257/295 |
| 5,406,445 | 4/1995 | Fujii et al. | 361/305 |
| 5,426,075 | 6/1995 | Perino et al. | 437/235 |
| 5,479,317 | 12/1995 | Ramesh | 361/321.5 |
| 5,519,235 | 5/1996 | Ramesh . | |
| 5,555,486 | 9/1996 | Kingon et al. | 361/305 |
| 5,561,307 | 10/1996 | Mihara et al. | 257/295 |

OTHER PUBLICATIONS

Kinney, "Signal magnitudes in high density ferroelectric memories," *Integrated Ferroelectrics*, vol. 4, 1994, pp. 131–144.

Prasad et al., Structure and ferroelectric properties of $Bi_2VO_{5.5}$ thin films by laser deposition, *Proceedings of the Eighth International Meeting on Ferroelectrics*, Gaithersburg, Maryland, 1993.

Satyalakshmi et al., "Epitaxial metallic $LaNiO_3$ thin films grown by pulsed laser deposition," *Applied Physics Letters*, vol. 62, 1993, pp. 1233–1235.

Tsuda et al., *Electronic Conduction in Oxides*, (Springer–Verlag, 1991), pp. 13, 14, 30–33, 39, 40.

*Primary Examiner*—Bot L. Ledynh
*Attorney, Agent, or Firm*—Joseph Giordano; David A. Hey; Loria B. Yeadon

[57] ABSTRACT

A ferroelectric capacitor structure and its method of making in which a ferroelectric stack of two metal-oxide electrodes sandwiching a ferroelectric layer is fabricated on a silicon substrate with an intervening barrier layer, preferably of TiN. In one embodiment, a platinum layer is grown between the TiN and the lower metal-oxide electrode at a sufficiently high temperature that provides crystallographically ordered growth of the ferroelectric stack. In another embodiment, the platinum layer was completely eliminated with the lower electrode being grown directly on the TiN. Although the conventional conductive metal-oxide used in the electrode is lanthanum strontium cobalt oxide (LSCO), lanthanum nickel oxide provides good electrical and lifetime characteristics in a ferroelectric cell. Alternatively, the electrodes can be formed of the rock-salt metal oxides, such as neodymium oxide (NdO).

3 Claims, 11 Drawing Sheets

ELECTRODE STRUCTURE FOR FERROELECTRIC CAPACITOR INTEGRATED ON SILICON

FIELD OF THE INVENTION

The invention generally relates to structures combining ferroelectric and other perovskite materials on a silicon substrate. In particular, the invention relates to a barrier layer interposed between a ferroelectric memory cell, including conductive metal oxide electrodes, and a silicon substrate. Such a barrier can perform several functions including preventing the poisoning of the semiconducting silicon by the oxygen in the electrodes.

BACKGROUND OF THE INVENTION

Integrated circuit memory cells have become increasingly important as personal computers and other computerized equipment have found acceptance in many and varied applications. Dynamic random-access memory (DRAM) is currently the most popular type of randomly accessible memory for personal computers, but it suffers from its need to be periodically refreshed and its loss of information in the case of a power failure or system crash. Static RAM relies on flip-flop circuitry and does not need to be refreshed, but it still loses its contents when power is removed. Furthermore, it requires considerably more power than DRAM. Non-volatile memories have been developed for certain critical applications in which memory loss is not acceptable. These range from preprogrammed read-only memory (ROM) to electrically alterable non-volatile memory, but these impose operational or cost penalties relative to DRAM and are difficult to integrate to the 64- and 256-megabyte levels currently promised by advanced DRAM technology.

Figure 1:
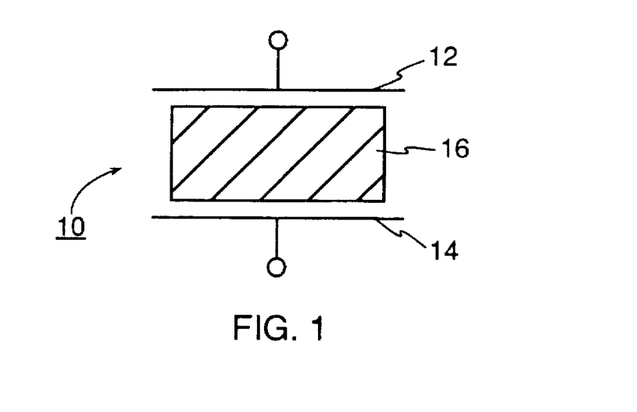
FIG. 1 is a schematical representation of a generic ferroelectric memory cell.

What is needed is a memory technology that offers not only non-volatile storage but also substantially no power requirement during prolonged storage and a structure as simple as the capacitive storage of DRAM so as to allow dense integration. Ferroelectric memories have long offered the possibility of satisfying these requirements. In very simple terms, as illustrated in FIG. 1, a basic ferroelectric memory cell 10 includes two capacitive electrodes 12, 14 sandwiching in its capacitive gap a ferroelectric material 16. A ferroelectric has the characteristic that it can assume two stable polarization states, generally referred to as up and down, dependent upon a poling voltage applied to it. Once induced into one of these polarization states, the polarizable material remains in the selected polarization station for very long periods of time. The polarization state determines the capacitance experienced by the electrodes 12, 14. Hence, once a memory cell has been poled into one of two states, the state is thereafter held without further powering and it can be read by measuring the pulsed capacitive response of the cell 10, that is, the ratio of charge to voltage across the cell. Furthermore, ferroelectrics typically manifest very high dielectric constants in either of their two states so that signal levels are relatively high compared to the area of the capacitors.

Although conceptually simple, a ferroelectric memory cell has been difficult to implement in an integrated circuit similar to a silicon DRAM. Materials manifesting the largest ferroelectric behavior are metal oxides, typically having a perovskite crystal structure. Hence, their integration into silicon circuitry has proved to be a major problem. Integration with silicon is desirable not only because silicon technology offers the experience of a major industry over several decades, but also silicon support circuitry is generally required to read, write, and otherwise control a dense ferroelectric memory array. Therefore, a commercially successful ferroelectric technology must be integrated with silicon materials and silicon processing. A greatly desired architecture includes a thin planar layer of a ferroelectric sandwiched between two electrode layers in an integrated vertical structure built upon a silicon substrate, similar to a DRAM.

However, ferroelectrics integrated on a silicon substrate present some fundamental problems. Ferroelectric materials are typically perovskites, such as the prototypical ferroelectric PZT (lead zirconium zirconate) although many other perovskite ferroelectrics are known, such as SrBiTaO and other materials to be listed later. These perovskites are rich in oxygen and usually need to be deposited at relatively high temperatures, at which the oxygen tends to diffuse out to the underlying material, in this case silicon. However, the semiconductivity of silicon is adversely affected by the incorporation of oxygen because of the ready formation of the insulating silicon dioxide.

This integration of ferroelectrics with silicon has produced several designs, each with its own difficulties. A popular design has included platinum electrodes sandwiching the ferroelectric. The platinum, being a noble metal, resists the diffusion of oxygen from the ferroelectric down to the underlying silicon. However, platinum is a metal, and unless it is carefully grown it forms as a polycrystalline layer. Hence, the ferroelectric deposited over it also has a random orientation with a large number of grain boundaries, which cause problems with reproducibility and reliability.

In U.S. Pat. No. 5,479,317 and U.S. patent application Ser. No. 08/341,728, filed Nov. 18, 1994 and now U.S. Pat. No. 5,519,235, Ramesh describes several structures which allow a ferroelectric stack to be deposited over a polysilicon plug connecting to an underlying crystalline silicon substrate including a transistor gating the memory cell of the ferroelectric stack. A first embodiment includes a barrier layer of TiN over which is deposited an oxygen-diffusion barrier of a tri-layer of Pt/Ti/Pt. The ferroelectric stack is deposited thereover, including two metal oxide electrodes of lanthanum strontium cobalt oxide (LSCO) sandwiching a ferroelectric layer of PZT or lead lanthanum zirconium titanate (PLZT) among other possible ferroelectrics. Whatever oxygen diffuses down from the electrodes or ferroelectric during their deposition at 550°–650° C. combines with the titanium and forms compact $TiO_x$ balls within a platinum matrix. However, the tri-level Pt/Ti/Pt involves excessive fabrication steps, results in an uncontrollable distribution of unconductive $TiO_x$ balls, and is more complex than desirable.

SUMMARY OF THE INVENTION

A ferroelectric cell of the present invention comprises a ferroelectric stack in which two metal-oxide electrodes sandwiching a ferroelectric layer are grown on a substrate such as silicon with an intervening barrier layer such as a refractory metal compound, for example, titanium nitride. The lower electrode can be grown directly on the barrier layer, or an intervening platinum layer can be grown at a sufficiently high temperature to promote crystallographically oriented growth of the ferroelectric layer. The metal-oxide electrodes may be composed of any number of well known conductive perovskites, of lanthanum nickel oxide, or of a rock-salt metal oxide, such as NdO and LaO.

DETAILED DESCRIPTION OF THE PREFERRED EMBODIMENTS

We have found that considerably simpler structures are available for the oxide electrode and the barrier layer of a ferroelectric memory cell. In particular, we have found that a properly prepared platinum layer facilitates the growth thereover of a ferroelectric cell including metal oxide electrodes. Indeed, under the proper conditions, the platinum can be dispensed with.

Figure 2:
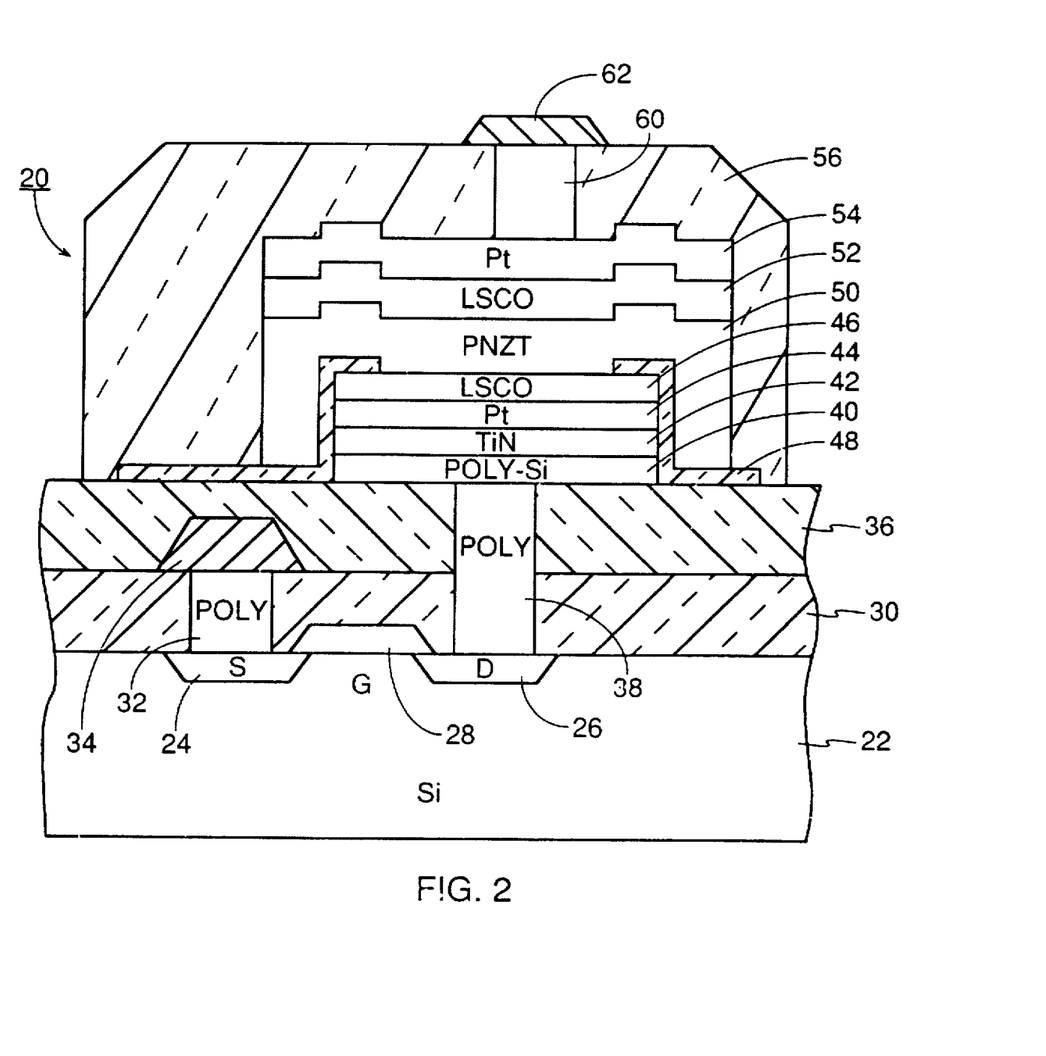
FIG. 2 is a cross-sectional view of a ferroelectric memory cell according to one embodiment of the invention.

An exemplary structure for a ferroelectric random access memory (FRAM) 20, similar to a silicon dynamic RAM, is illustrated in cross section in FIG. 2. It is understood that this FRAM structure is replicated many times to form a large FRAM integrated circuit and that other support circuitry needs to be formed as well in the same chip. The overall FRAM structure, with a few exceptions, is known and has been disclosed by Ramesh in the previously cited U.S. patents and applications. Kinney provides a good overview in "Signal magnitudes in high density ferroelectric memories," *Integrated Ferroelectrics*, vol. 4, 1994, pp. 131–144. The FRAM 20 is formed on a (001)-oriented crystalline silicon substrate 22 so that other silicon circuitry can easily be incorporated. A metal-oxide-semiconductor (MOS) transistor is formed by diffusing or implanting dopants of conductivity type opposite to that of the substrate 22 into source and drain wells 24, 26. The intervening gate region is overlaid with a gate structure 28 including a lower gate oxide and an upper metal gate line, e.g., aluminum, to control the gate.

A first inter-level dielectric layer 30, for example of silicon dioxide, is deposited over the substrate 22 and the transistor structure. A via 32 is photolithographically etched through the first inter-level dielectric layer 30 over the source well 24, and polysilicon is filled therein to form a polysilicon contact plug to the transistor source. A metal source line 34 is photolithographically delineated on top of the first inter-level dielectric layer 30 and electrically contacts the polysilicon plug 32.

A second inter-level dielectric layer 36 is then deposited over the first inter-level dielectric layer 30. Another via 38 is etched through both the first and second inter-level dielectric layers 30, 36 over the area of drain well 26, and polysilicon is filled therein to form a contact to the transistor drain. The processing up to this point is very standard in silicon technology.

A lift-off mask is then deposited and defined to have an aperture over the drain via 38 but of a larger area for the desired size of capacitor, although in commercial manufacture a masked dry plasma etch would typically be performed. Over the mask and into the aperture are deposited a sequence of layers. A polysilicon layer 40 provides good electrical contact to the polysilicon plug 38. A TiN layer 42 and a platinum layer 44 form conductive barrier layers between the polysilicon and the oxidizing metal-oxide contacts. Polysilicon is semiconductive, but, if its surface is oxidized into $SiO_2$, a stable, insulating layer is formed that prevents electrical contact. The TiN and platinum layers 42, 44 and variations on the combination are central to the present invention. Over the platinum layer 44 is deposited a layer 46 of a conductive metal-oxide, preferably a perovskite, such as lanthanum strontium cobalt oxide (LSCO), although other metal oxides may be used, especially layered perovskites. This material has a composition nominally given by $La_{0.5}Sr_{0.5}CoO_3$, although compositions of approximately $La_{1-x}Sr_xCoO_3$ are possible with $0.15 \geq x \geq 0.85$. It is now well known that LSCO forms an acceptable electrical contact and further promotes highly oriented growth of perovskite ferroelectric materials.

The photomask is then lifted off leaving the lower stack of layers 40, 42, 44, 46 shown in FIG. 2. Another photomask is then defined allowing the conformal deposition of a Z-shaped field-oxide layer 48, which covers the sides of the previously defined lower stack, has a rim extending over the edge of the upper surface of the lower stack, and has a foot extending outwardly from the bottom of the lower stack, but leaves a central aperture for the after deposited upper ferroelectric stack. The field-oxide layer 48 electrically insulates the after deposited ferroelectric from the side portions of the lower electrode.

In the past, the field-oxide layer 48 has been formed of $SiO_2$ or $TiO_2$, but neither of these materials are ideal. Perovoskite ferroelectrics when deposited over these materials tend to form in a mixture of perovskite and pyrochlore phases, which then differentially etch, producing unreliable etching. A better material for the field oxide layer 48 is bismuth titanate (approximately of the stoichiometric composition $Bi_4Ti_3O_{12}$), which is a perovskite and can be grown by the same growth process as the other perovskite layers. Ramesh in U.S. Pat. No. 5,248,564 discloses that $Bi_4Ti_3O_{12}$ is a powerful templating layer for promoting the growth of crystallographically oriented perovoskites over unoriented substrates so a $Bi_4Ti_3O_{12}$ field oxide layer 48 assures good quality ferroelectrics are grown over it. Other perovskite materials may be substituted for the bismuth titanate as long as they are not highly conducting and they display a low dielectric constant, e.g., not be a ferroelectric. For most effective templating, the perosvkite should have a layered structure, that is, have a c-axis that is at least twice the a- and b-axes.

After the formation of the field oxide 48, another photomask is deposited and defined that includes an aperture around the lower stack 40, 42, 44, 46 but the outer periphery of its bottom overlies the feet of the field-oxide layer 48. A ferroelectric layer 50 is then deposited under conditions favoring crystallographically oriented growth. Preferably, the ferroelectric layer 50 comprises lead niobium zirconium titanate (PNZT). The deposition of the perovskite ferroelectric layer over LSCO or other similar perovskite conductive electrodes allows the ferroelectric to be deposited at relatively low temperatures but still manifest favorable crystallinity. Over the ferroelectric layer 50 is deposited an upper conductive metal-oxide layer 52, preferably symmetrically formed with the lower conductive metal-oxide layer 44 of a perovskite, such as LSCO. An upper platinum layer 54 is deposited over the upper conductive metal-oxide layer 52. This layer 54 is not considered to involve critical technology, and its platinum composition was selected only as an interim solution. It is anticipated that the composition will be changed to TiW or other metallizations common in silicon technology. After the upper platinum layer 54 is deposited, the photomask is lifted off leaving the structure of the upper stack illustrated in FIG. 2.

A third inter-layer dielectric layer 56 is deposited and etched to cover the ferroelectric stack. This layer 56 is intended more as a passivation layer than as an inter-layer dielectric.

The upper electrode 54 is then electrically contacted by etching a via 60 through the third inter-level dielectric layer 56 overlying the ferroelectric stack, filling the via 60 with Ti/W, and delineating a metal capacitor line 62 of Al that electrically contacts the Ti/W plug 60.

We have found that depositing the lower platinum layer 44 at relatively high temperatures, in the neighborhood of 500°–550° C., allows the deposition of the ferroelectric stack (the ferroelectric and the two sandwiching metal-oxide layers) at a higher thermal budget, which is defined as the integral of the temperature (measured in °C.) and the time at the temperature. Since the three layers are typically deposited in a single chamber at a single temperature, the thermal budget becomes the product of the deposition temperature and the total deposition time.

EXAMPLE 1

Figure 3:
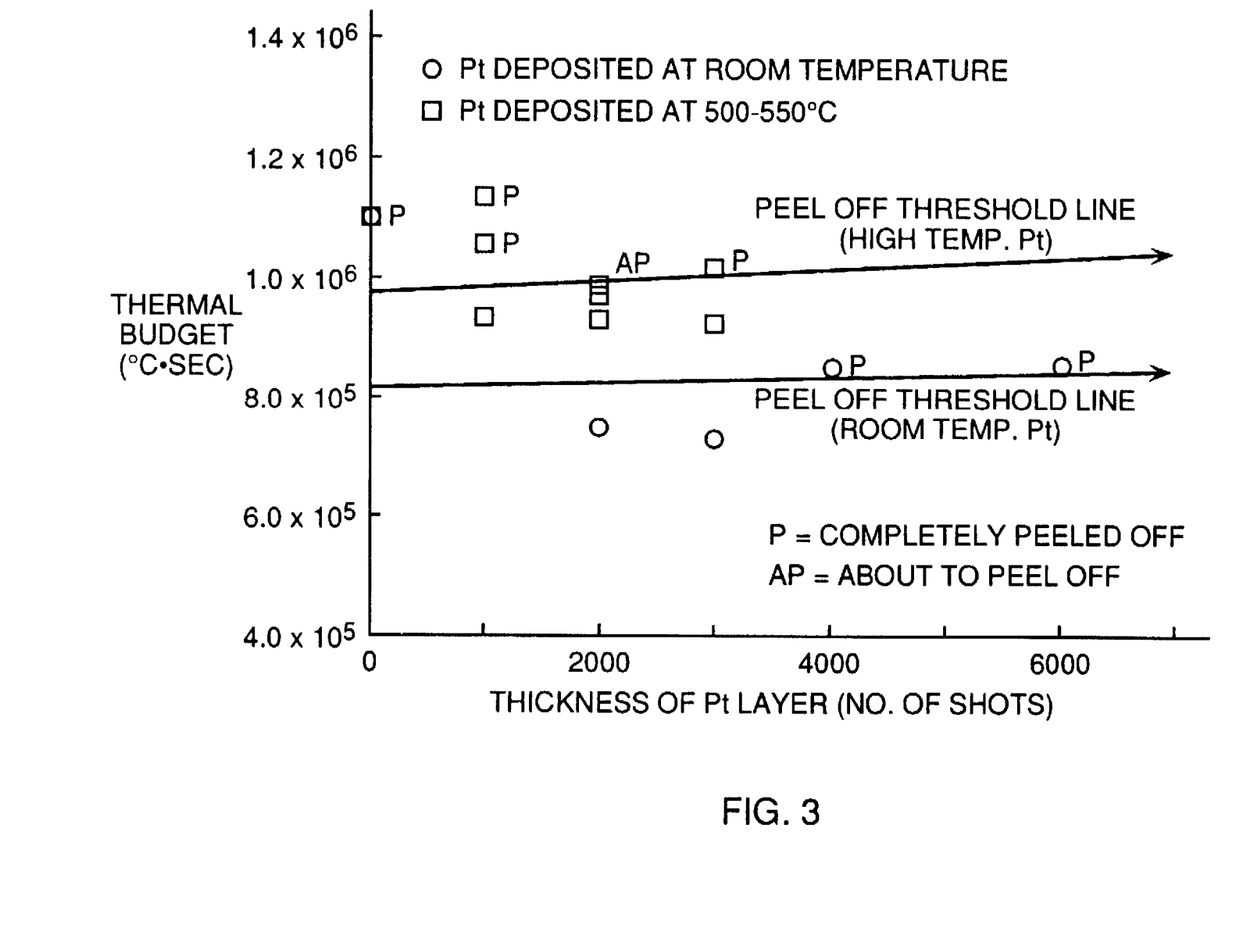
FIG. 3 is a graph showing the dependence of peeling of a ferroelectric memory stack from a silicon-based substrate as a parameter of the temperature of platinum deposition.

An important but simple measure of the quality of a deposited ferroelectric stack is whether the stack peels off the substrate on which it is deposited. Generally, peeling occurs when a threshold in the thermal budget is passed, that is, when the integral of the temperature over time exceeds the threshold value. FIG. 3 presents many data points for an unpatterned ferroelectric stack of LSCO/PNZT/LSCO grown over Pt/TiN/poly-Si/Si. The composition of the 300 nm-thick PNZT layer was $PbNb_{0.04}Zr_{0.28}Ti_{0.68}O_3$ and the composition of the 100 nm-thick LSCO electrodes was $La_{0.5}Sr_{0.5}CoO_3$. The layers of the ferroelectric stack were grown by pulsed laser deposition using a KrF excimer laser pulsed at 5 Hz to produce a fluence of 3 J-cm$^2$ on the Pt, LSCO, or PNZT target being sputtered. The substrate was held in an environment of 100 mTorr of $O_2$. The temperature of the substrate holder was controlled to values mentioned below as being the substrate temperature. It is believed that the actual temperatures of the sample were about 20° to 40° C. lower for a 500° to 600° C. deposition, but the difference was almost negligible for a room-temperature deposition.

The data of FIG. 3 are presented as a function of the thickness of platinum layer (measured in the number of shots for pulsed laser deposition of Pt) and the thermal budget for growth of the ferroelectric stack. However, the substrates were received with a Pt/TiN/poly-Si/Si structure already formed, with the platinum being preformed in a low-temperature process. The preformed TiN layer typically had a thickness of 50 to 70 nm, and the polysilicon layer had a thickness of 100 to 500 nm. The data are parametrized according to the deposition temperature for the platinum layer. The squares represents samples having the additional lower platinum layer deposited at a temperature of 500° to 550° C.; the circles represent samples having the additional lower platinum layer deposited at room temperature, nominally 20° C. Those samples that peeled are identified by "P" while those that were about to peel are identified by "AP". Samples not so identified passed the peel test. Both samples peeled that had no additional Pt. It is seen that, with the exception of the samples with no added platinum, the samples with platinum deposited at room temperature had a threshold for peeling at a thermal budget at about $8 \times 10^{5}$°C.-sec while the peeling threshold was just below $1 \times 10^{6}$°C.-sec for samples with platinum deposited at 500° C. or above.

Figure 4:
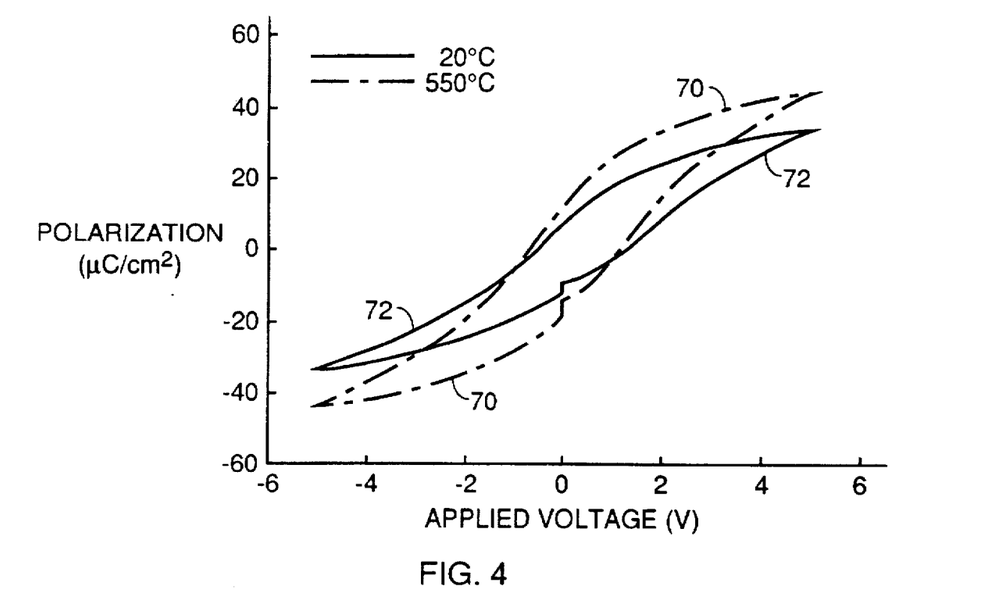
FIG. 4 is a graph of a hysteresis curve of a ferroelectric capacitor of the invention.

It is apparent that a higher-temperature deposition of Pt is preferred, at least for mechanical stability. The preference is based also on electrical characterization. FIG. 4 is a graph showing the room-temperature hysteresis loops for samples of the above compositions with the ferroelectric stack of LSCO/PNZT/LSCO deposited on Pt/TiN/poly-Si/Si at either 20° or 550° C. The fabricated ferroelectric capacitors were considerably simpler than the ferroelectric memory cells of FIG. 2. Instead, they were patterned by a photolithographic lift-off process of the top Pt layer. The Pt electrodes then served as masks for wet chemical etching of the upper LSCO electrodes using a 1% $HNO_3$ solution. The tested capacitors had diameters of 50 μm, and a much larger capacitor was used to couple the electrical test signal to the substrate.

Trace 70 shows the hysteresis loop for the ferroelectric cell with the added Pt deposited at 550° C. while trace 72 shows the loop for the added Pt deposited at 20° C. The 550° C. sample had a remanent polarization ΔP between the switched and unswitched polarizations of 13 μC/cm$^2$. The corresponding values for the 20° C. sample was 7.2 μC/cm$^2$, distinctly inferior to the sample with the higher temperature of deposition for Pt.

Figure 5:
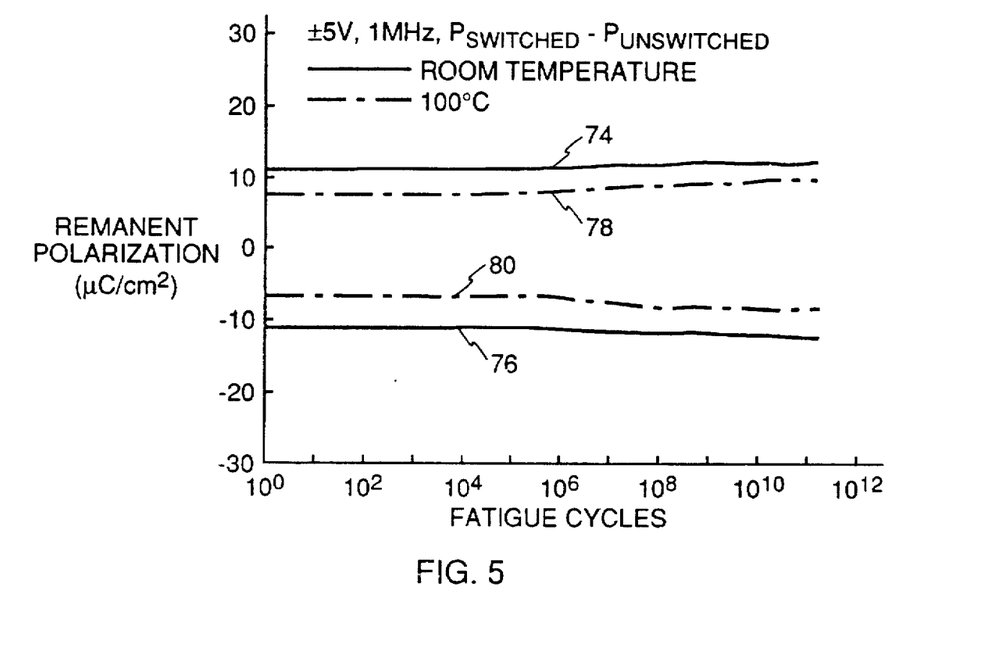
FIG. 5 is a graph of the fatigue of the ferroelectric capacitor of FIG. 4.

The ferroelectric cells made by the above process exhibit little fatigue. Fatigue curves are shown in the graph of FIG. 5 for the cell described above with the Pt deposited at 550° C. Fatigue is measured in terms of remanent polarization between the switched and unswitched states. The data was generated for voltage swings of ±5V at a 1 MHz cycle rate. Curves 74, 76 give the remanent polarization with the cell operated at room temperature, and curves 78, 80 are for operation at 100° C. Even at the elevated operational temperature, little fatigue is seen after $10^{11}$ cycles.

The most preferred range for the deposition of the platinum layer includes 500° to 550° C. The lower end of the range is most preferably 500° C. because this is a minimum temperature for the perovskite deposition and it is preferable that the depositions be done at the same temperature, but significantly advantageous results are obtainable as low as 450° C. or even 400° C. The effect has not been quantized, but any temperature significantly above room temperature is expected to provide some improvement. The upper end of the range has not been established, but any further increase in temperature will also increase the thermal budget, which is known to be deleterious to peeling even though an increase in the Pt deposition temperature is known to be beneficial. It is believed that the high Pt deposition temperature affects the grain structure of the platinum, the higher deposition temperature producing a denser Pt layer, which is also explainable in terms of larger Pt grains with fewer inter-granular boundaries. As a further consideration, TiN increasingly oxidizes at temperatures above 500° C. The temperature range up to 550° C. may provide minimally acceptable oxidation and perhaps 600° C. is also acceptable, but it would be better to keep the temperature of the exposed TiN during Pt deposition below 500° C.

Figure 6:
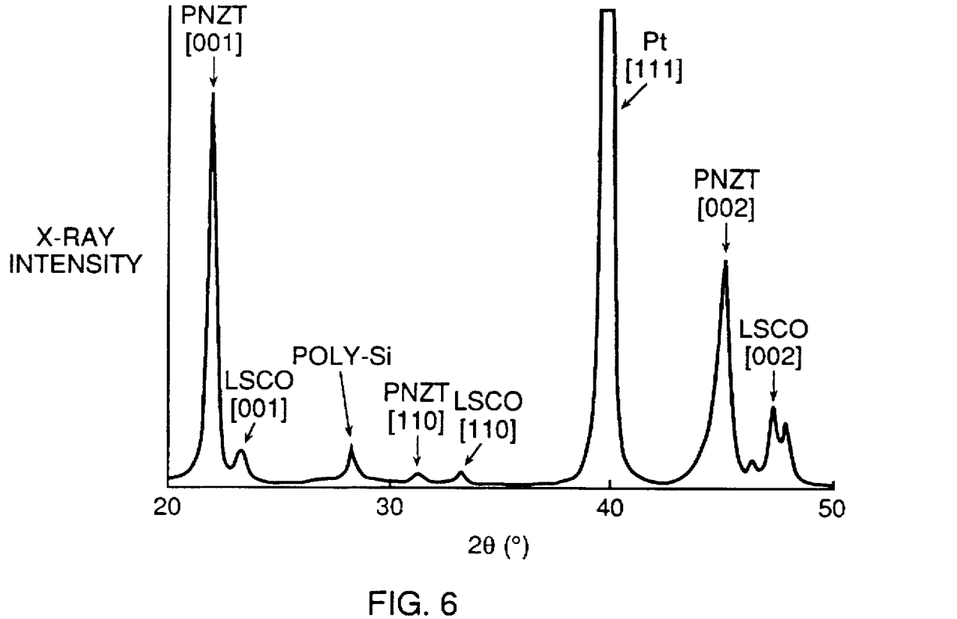
FIG. 6 is an X-ray diffraction pattern of a composite grown according to the invention.

A more fundamental and physical justification for the higher temperatures for the growth of platinum is provided by x-ray diffraction data showing the relative prevalence of various orientations of the different layers. The diffraction pattern for an unpatterned ferroelectric stack of LSCO/PNZT/LSCO is shown in FIG. 6. This is a stack of LSCO/$Pb_{0.04}Nb_{0.28}Zr_{0.68}TiO_3$/LSCO deposited on a substrate of Pt/TiN/poly-Si/Si at a substrate holder temperature of 600° C. The crystallographic designations for PNZT and LSCO are consistent with a perovskite crystal structure. The pyrochlore phase would produce a peak at 35°. In general, the [110] peaks of PNZT and LSCO are not desirable because they result from a non-columnar crystal structure. The quality of the dielectric stack is quantized by the ratio of the [001] peaks of the perovskite materials relative to their [110] peaks.

Figure 7:
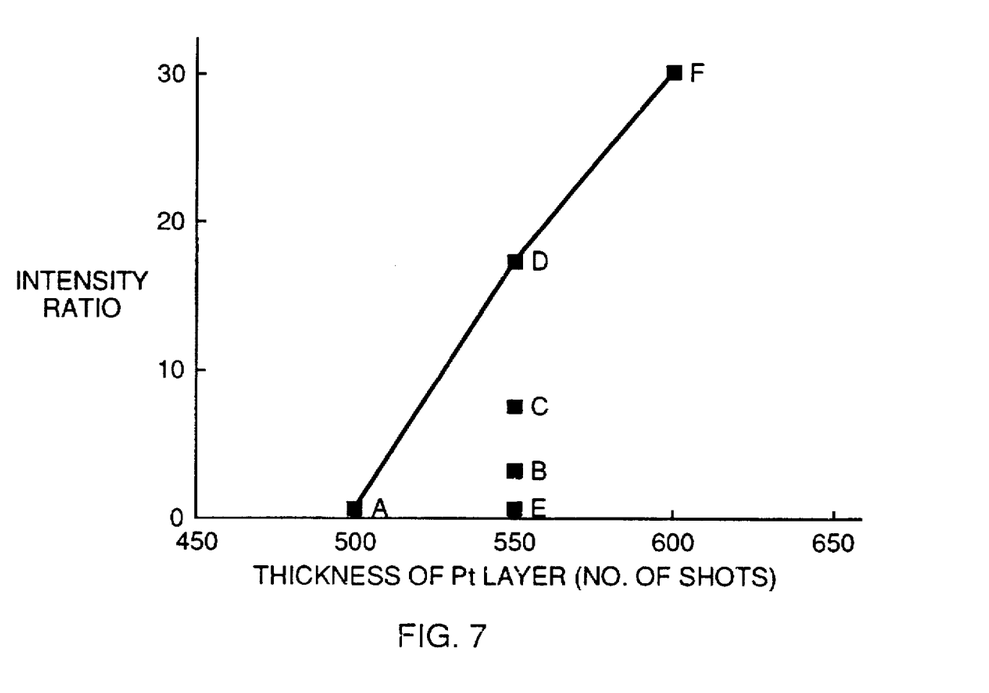
FIG. 7 is a graph summarizing some of the data of FIG. 6.

FIG. 7 shows the ratios of the X-ray peak for PNZT at [001] versus the peak at [110]. The various points are represented by letters corresponding to the temperatures of laser deposition given in TABLE 1.

TABLE 1

| SAMPLE | LSCO (°C.) | PNZT (°C.) | Pt (°C.) |
|--------|------------|------------|----------|
| A | 500 | 500 | 500 |
| B | 500 | 550 | 500 |
| C | 550 | 550 | 500 |
| D | 550 | 550 | 550 |
| E | 550 | 550 | 20 |
| F | 600 | 600 | 20 |

This figure shows that an increasing temperature of deposition for the ferroelectric PNZT increases the crystallographic quality. However, the increased temperature also increases the thermal budget, and, as shown in FIG. 3, an increased thermal budget degrades the bonding. Hence, FIG. 7 shows that a growth temperature of 500° to 600° C., as measured in the substrate holder for the pulsed laser deposition of the examples, subsumes a preferred deposition temperature range for the ferroelectric, and, assuming concurrent growth, a preferred deposition temperature range for the entire ferroelectric stack.

Scanning electron micrographs (SEMs) show the after grown layers of LSCO and the perovskite ferroelectric to have a distinctly columnar structure extending above the Pt substrate. The SEMs show that the TiN seems to be of a single phase. No oxidation of the TiN layer was observed in either the x-ray diffraction data or the electron diffraction pattern. The resistivity of the PNZT layer was measured at between $2 \times 10^9$ and $10^{10}$ Ω-cm.

EXAMPLE 2

Another set of substrates were commerically obtained that had a TiN layer but no low-temperature Pt layer. These samples showed that it is possible to completely dispense with the platinum layer. The conclusion is that Pt deposited at high temperature is acceptable though not necessary, but that low-temperature platinum introduces failure mechanisms.

Figure 8:
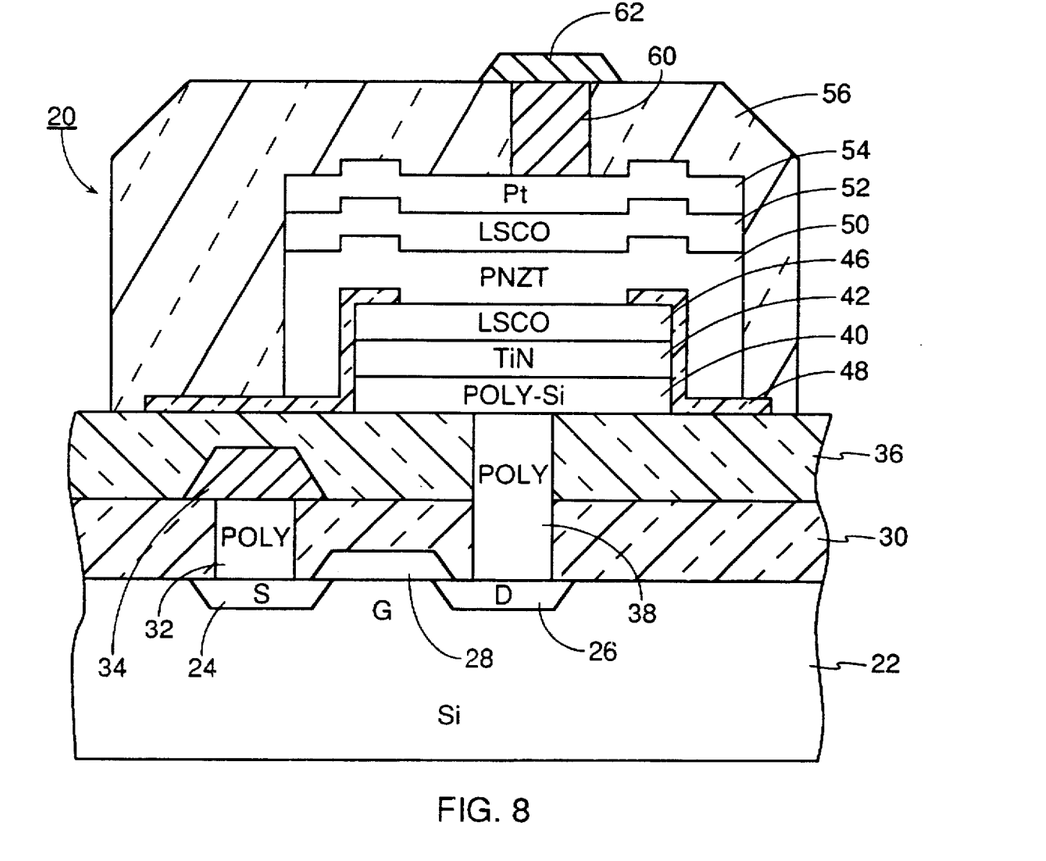
FIG. 8 is a cross-sectional view of another ferroelectric memory cell of the invention.

Ferroelectric capacitors were fabricated on these stock wafers having a vertical structure of TiN/polysilicon/crystalline silicon. A ferroelectric stack of LSCO/$Pb_{0.04}Nb_{0.18}Zr_{0.78}TiO_3$/LSCO was deposited at 550° C. by pulsed laser ablation, as described before for both the deposited structure and the deposition and definition methods. The intended structure of the operational ferroelectric cell is illustrated in the cross section of FIG. 8 in which no Pt layer is interposed between the TiN barrier layer 40 and the lower LSCO electrode 46. However, the structure was experimentally verified with the simpler capacitors without transistors, as previously described.

Figure 9:
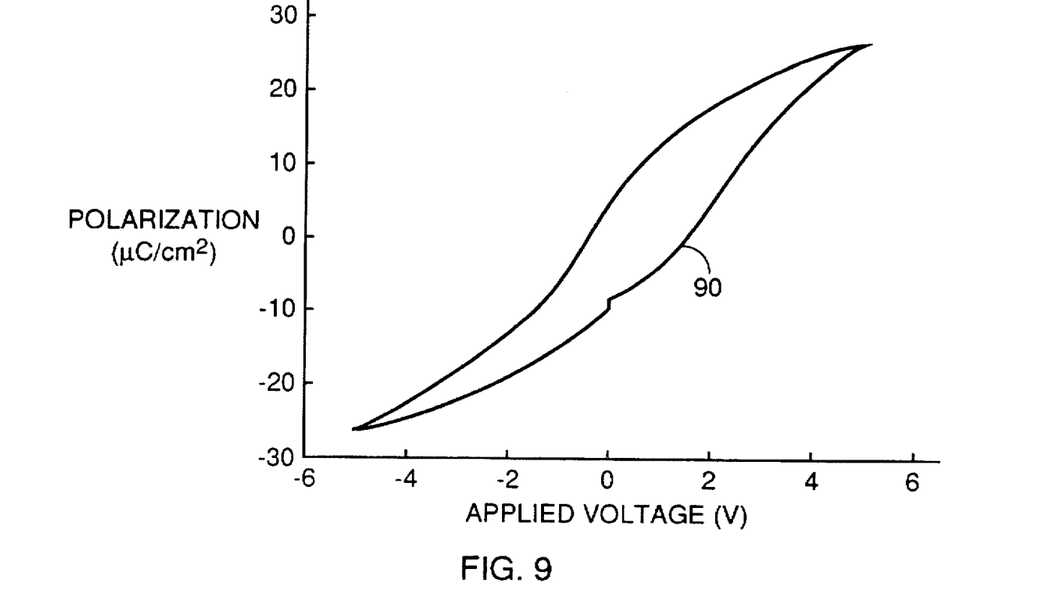
FIG. 9 is a graph of the hysteresis of a ferroelectric capacitor corresponding to the memory cell of FIG. 8.
Figure 10:
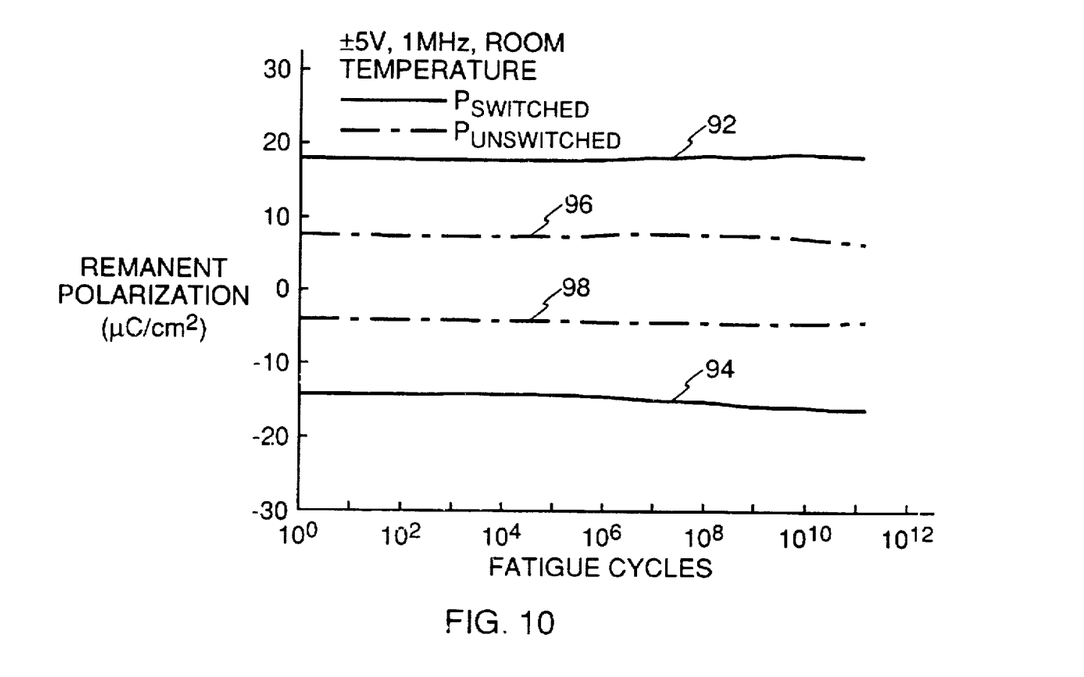
FIGS. 10 and 10A are graphs of the fatigue of the ferroelectric capacitor of FIG. 9.
Figure 10A:
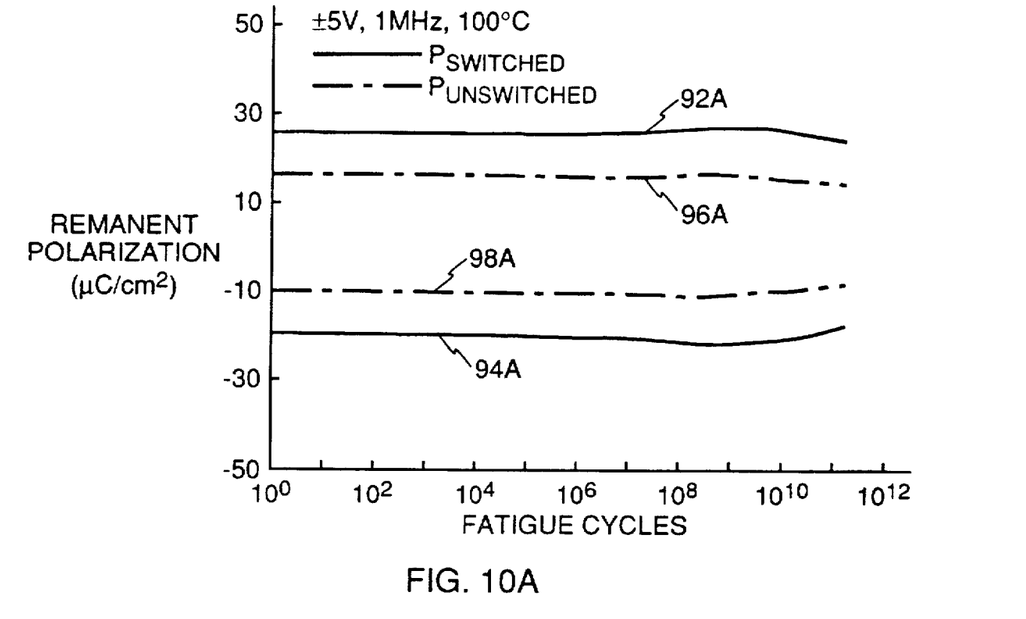

Curve 90 in the graph of FIG. 9 shows the resultant hysteresis curve. Virtually the same curve 90 is obtained before and after an imprinting procedure of impressing 5V for 1 hour at 100° C. The fatigue behavior of this capacitor with the ferroelectric stack grown at 550° C. is shown in the graph of FIG. 10 for room-temperature fatigue testing of the sample and in the graph of FIG. 10A for testing at 100° C. The remanent polarization is measured using the parameters described for FIG. 3. In the case of the room-temperature experiments shown in FIG. 10, curves 92, 94 give the values for the switched polarization and curves 96, 98 give the values for the unswitched polarization. Corresponding results for testing at 100° C. is shown by curves 92A, 94A, 96A, 98A in FIG. 10A.

Figure 11:
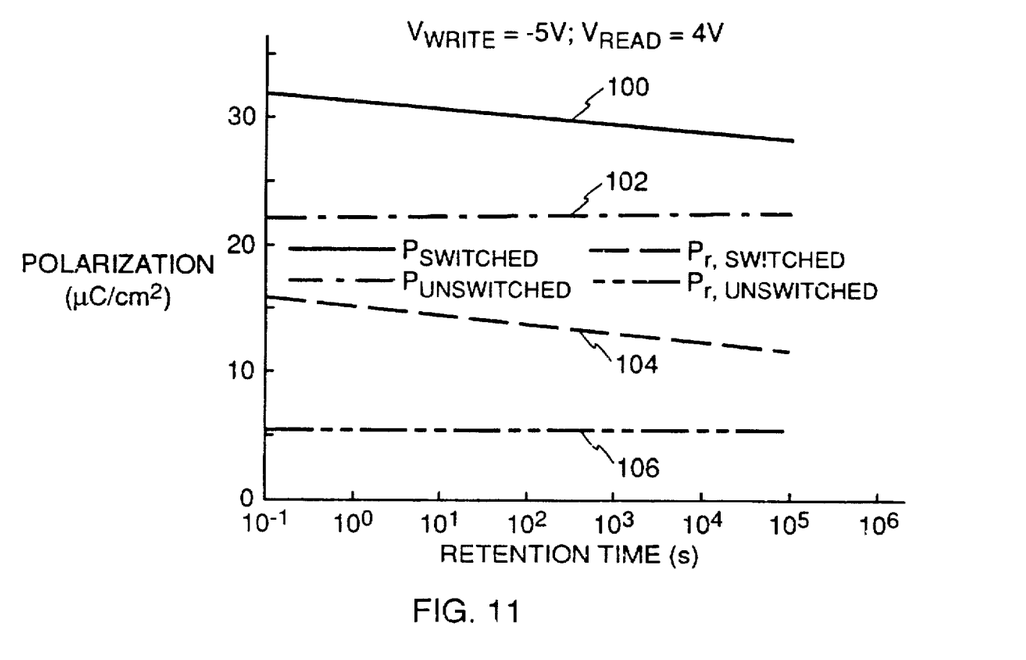
FIGS. 11 and 11A are graphs of the logic-state retention of the ferroelectric capacitor of FIG. 9.
Figure 11A:
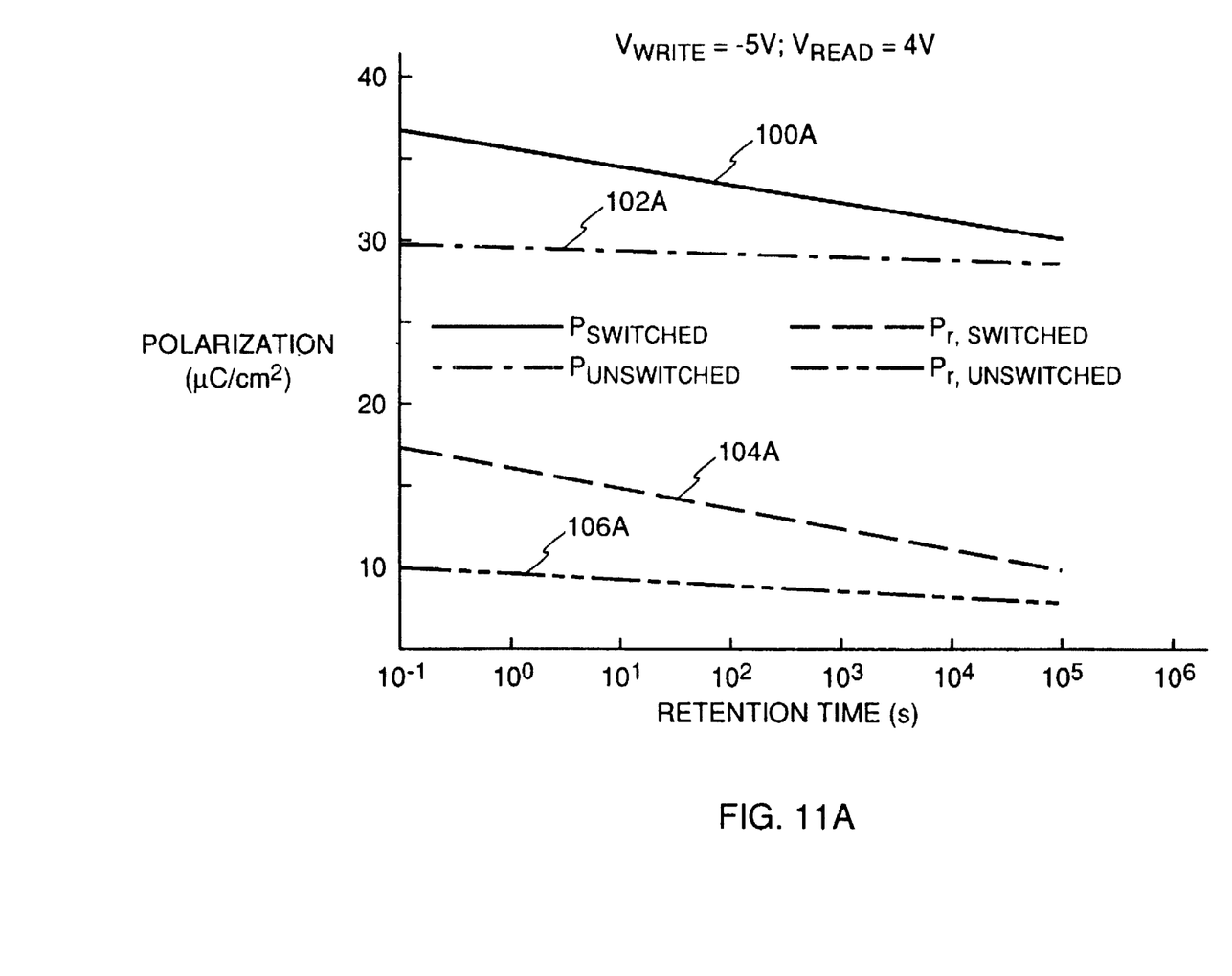

Retention of logic states over time is shown in the graph of FIG. 11 for the same sample when held at room temperature and in the graph of FIG. 11A when held at 100° C. The write voltage was −5V and the read voltage was +4V. In the case of the room-temperature experiments shown in FIG. 11, curves 100, 102 show respectively the switched and unswitched polarization as a function of retention time, and curves 104, 106 show respectively the switched and unswitched remanent polarization. Similar high-temperature data is shown by curves, 100A, 102A, 104A, 106A in FIG. 11A. Although there is some change over $10^5$ seconds (about 1 day), the behavior can be operationally accommodated.

Ferroelectric capacitors that were platinum free were deposited at a series of temperature. The depositions at 500° and 550° C. produced good results, but preliminary results from a deposition at 600° C. did not produce positive results.

The fabrication of a ferroelectric element without a platinum layer is advantageous for at least two reasons. It reduces the number of deposition steps, and the platinum has always been difficult to etch, which needs to be done to delineate many ferroelectric elements on an integrated circuit.

The platinum-free embodiment of the invention is relatively simple and runs counter to several years of development in the technology of ferroelectric memories. Earliest ones of these memories used platinum electrodes adjacent to the ferroelectric layer. When this structure proved unsatisfactory, many improvements were suggested, such as the TiN barrier layer and the intervening metal-oxide layer, initially characterized as a crystalline growth template. However, the platinum layer was typically retained.

Figure 12:
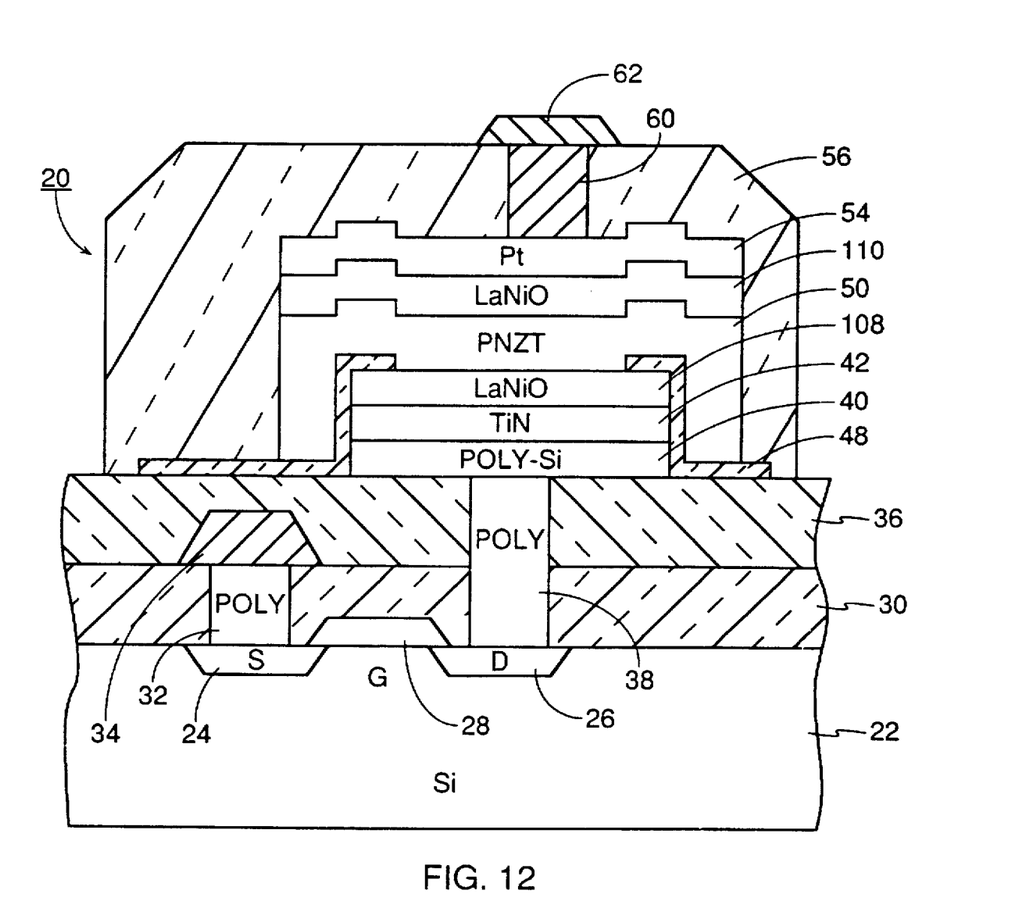
FIG. 12 is a cross-sectional view of yet another ferroelectric memory cell of the invention utilizing lanthanum nickel oxide (LNO) as part of the electrode.

An interesting conductive metal oxide, though hitherto not widely considered for microelectronics, is the conductive perovskite material $LaNiO_3$. This material produces the ferroelectric cell shown in the cross section of FIG. 12, in which the LSCO electrodes are replaced by LaNiO₃ (LNO) electrodes 108, 110 and with no platinum intervening above the TiN barrier layer. It is appreciated that exact stoichiometry of the composition is not required. Tsuda et al. describe not only LaNiO₃ but also other conductive LaNiO compounds, ibid., pp. 14, 39, 40 and references thereat.

EXAMPLE 3

Lanthanum nickel oxide (LNO) was tested for a series of simply defined capacitors. The ferroelectric stack consisted of LaNiO₃ electrodes sandwiching the previously described PNZT ferroelectric layer. The stack was formed on a substrate of TiN/polysilicon/crystalline silicon, as has previously been described, that is, the LNO replaces the LSCO of the previously described example. As a result, the lower part of the ferroelectric cell was free of platinum. The ferroelectric stack was deposited by single pulsed laser ablation process carried out at a substrate temperature of 550° C.

Figure 13:
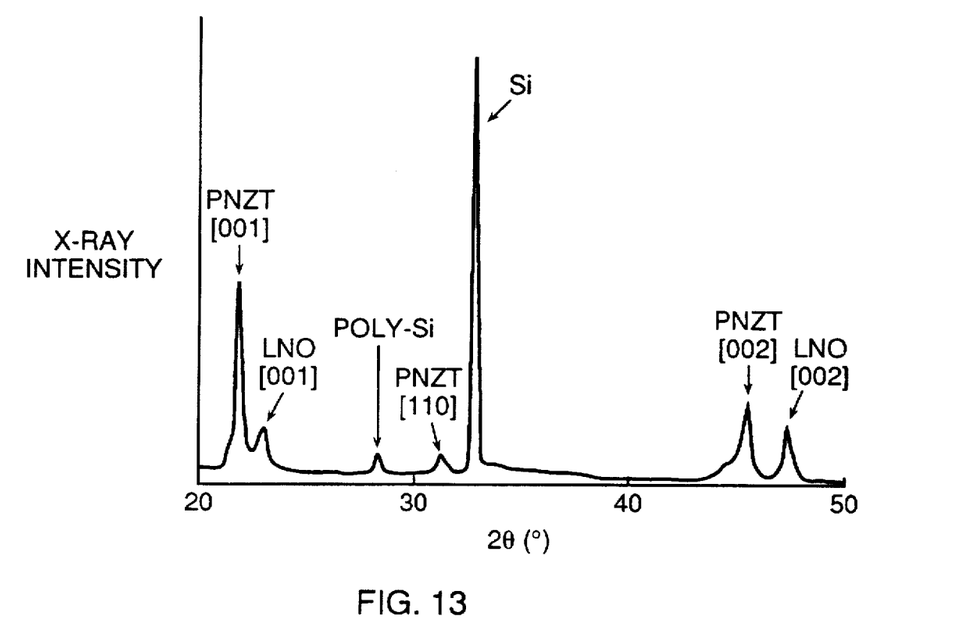
FIG. 13 is an X-ray diffraction pattern of a multi-layer structure required for the LNO ferroelectric memory cell of FIG. 12.

The X-ray diffraction scan for the undefined LNO wafer is shown in FIG. 13. It shows relatively strong crystalline [001] alignment for LNO and very strong [001] alignment for PNZT with relatively little [110] alignment for PNZT. More importantly, neither PNZT nor LNO shows a pyrochlore peak at 35° with all the non-silicon peaks being identified with the perovskite phase.

Figure 14:
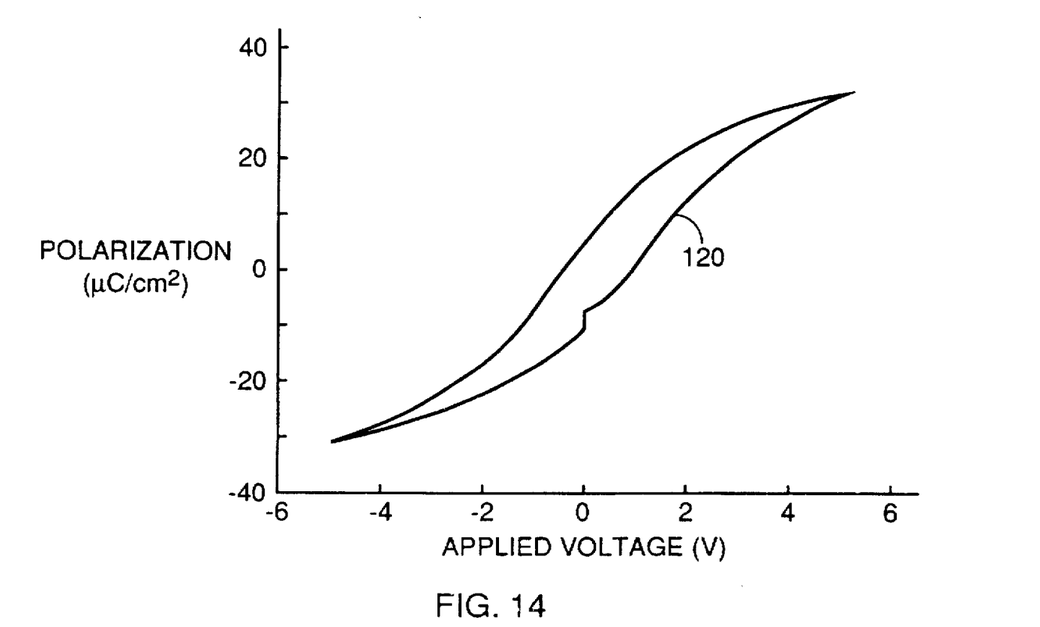
FIG. 14 is a graph showing the hysteresis loop for a capacitor structure using LNO as an electrode material, just as in the memory cell of FIG. 12.
Figure 15:
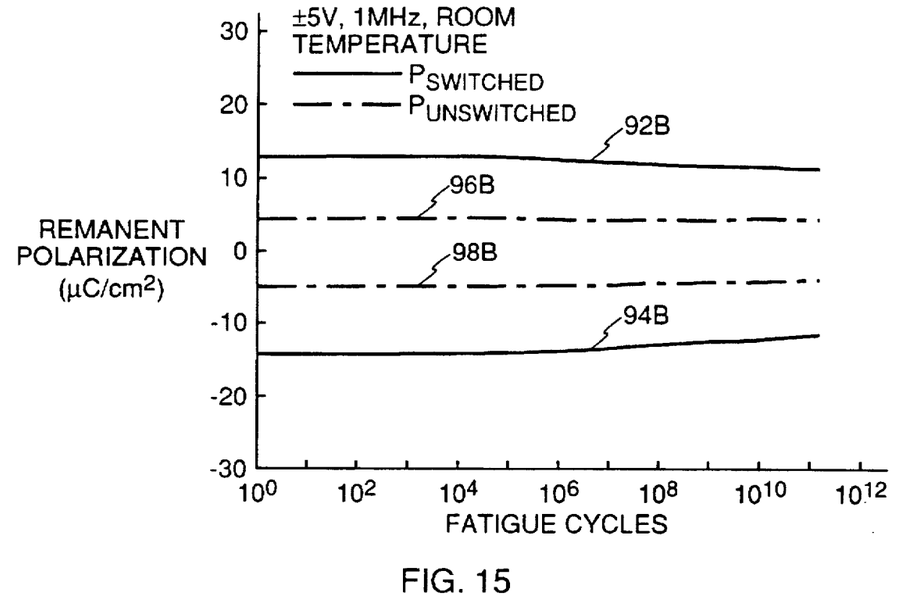
FIG. 15 is a graph of fatigue characteristics of the LNO capacitor structure.
Figure 16:
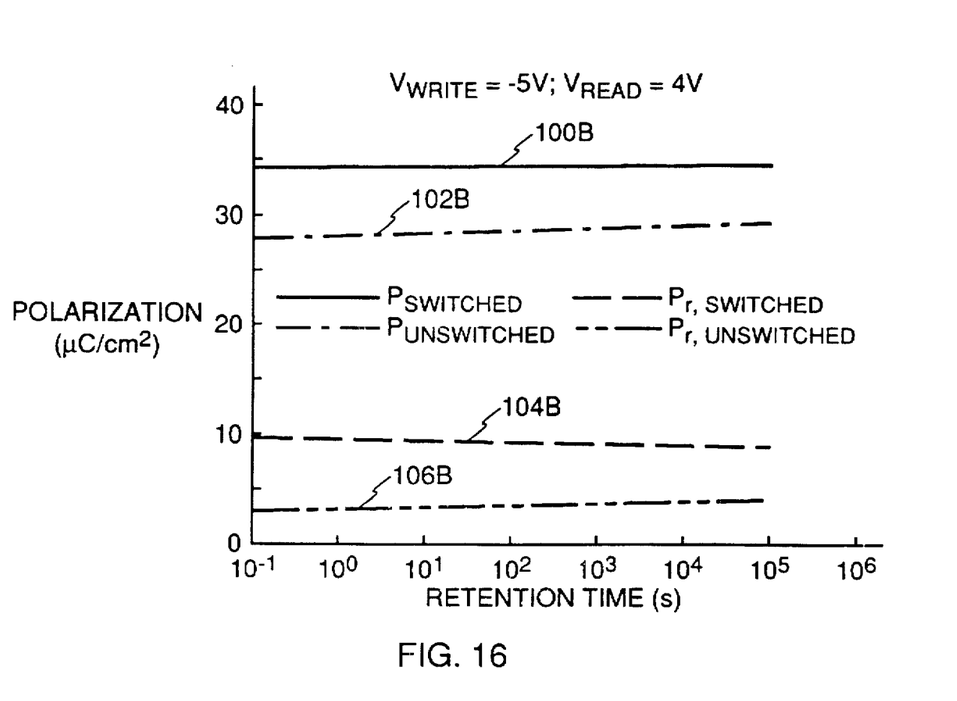
FIG. 16 is a graph of logic-state retention of the LNO capacitor structure.

A room-temperature hysteresis loop for a ferroelectric capacitor defined from this wafer is shown by trace 120 shown in graph of FIG. 14, which appears to be somewhat better than the hysteresis demonstrated by the platinized ferroelectric cell in FIG. 4. The room-temperature fatigue of the LNO cell, shown by traces 92B, 94B, 94C, 98C in the graph of FIG. 15 differed somewhat from that of the platinum-free, LSCO cell shown by the corresponding traces 92, 94, 96, 98 in FIG. 10 but had the same magnitude of changes. The retention of logic states at room temperature, shown in traces 100A, 102B, 104B, 106B shown in the graph of FIG. 16, shows much less temporal change than the corresponding traces 100, 102, 104, 106 shown in FIG. 11 for a platinum-free LSCO cell, but the LNO cells generally exhibit lower values for the various polarizations.

Based on these data, electrodes based on lanthanum nickel oxide without platinum exhibit behavior generally equal to or better than electrodes based on LSCO with or without a platinum barrier layer. The use of lanthanum nickel oxide as a perovskite metal-oxide electrode is not restricted to polarizable ferroelectric capacitors but is also applicable to other situations in which a perovskite material needs to be electrically contacted, for example, in nonpolarizable ferroelectric capacitors, superconductive elements, or magnetic heads.

Prasad et al. have previously described the use of a LaNiO₃ electrode underlying a ferroelectric layer of Bi₂VO₅.₅ in "Structure and ferroelectric properties of Bi₂VO₅.₅ thin films by laser deposition", *Proceedings of the Eighth International Meeting on Ferroelectrics*, Gaithersburg, Md., 1993. They characterize this material as pseudocubic. However, the LNO layer of this reference was deposited only upon a conductive metal-oxide perovskite or upon insulative SiO₂, not upon a conductive material which is neither oxide nor perovskite but is, in the example, the conductive compound TiN, that is metallically conductive and generally polycrystalline when processed at low temperatures below 650° C. Satyalakshmi et al. have described, in "Epitaxial metallic LaNiO₃ thin films grown by pulsed laser deposition," *Applied Physics Letters*, vol. 62, 1993, pp. 1233–1235, the growth of crystallographic oriented LaNiO₃ over several crystalline perovksites as well as yttria-stabilized zirconia (YSZ), a generally polycrystalline insulating material, and they also suggest several device applications. The present invention is distinguished by the fabrication of LNO electrodes on a non-perovskite, generally amorphous, metallically conductive layer, such as TiN.

Another class of conductive metal oxides for the electrodes of the various embodiments discussed here includes the compounds NdO, NbO, SmO, LaO, and VO. These materials exhibit a rock-salt (NaCl) crystal structure, that is, face-centered cubic. Tsuda et al., ibid., pp. 13, 30–33 and references cited thereat describe these materials and their low resistivity. These rock-salt conductive materials would replace the LSCO for the upper and lower electrodes in the embodiments of FIGS. 2 and 8.

The above described embodiments are intended to be only exemplary and not at all limiting. Many variations are anticipated, and others are included within the invention as defined by the claims.

The ferroelectric layer may be formed from several different families of ferroelectric materials, $Pb_{1-y}La_y(Zr, Ti, Nb)O_3$, $Ba_{1-x}Sr_xTiO_3$, and $BiSr(Ta,Nb)O$ being among the most presently popular choices.

The perovskite electrodes may be formed of other materials, such as $(Sr,Ca)RuO_3$, LaSrVO, YBaCuO, and BiSrCaCuO among others. Many of these have been thoroughly investigated for low-$T_C$ superconductivity.

The TiN barrier layer can be replaced by a number of other materials that are electrically conductive compounds of a refractory metal and an anion, especially nitrogen. The most prominent of these are titanium tungsten nitride and tantalum silicon nitride.

Although the invention has been explained in the context of the integration of a nonvolatile ferroelectric capacitor on a silicon chip, presently the most commercially important use being contemplated, the invention is not so limited. The perovskite material need not be a bistable ferroelectric. Other perovskites, especially some ferroelectrics, demonstrate very large dielectric constants but are not bistable. That is, such a ferroelectric capacitor has a very large capacitance per unit area but does not provide a volatile memory, only a large capacitance or a small volatile memory cell. Also, perovskites may be incorporated into superconducting circuit elements and various magnetic sensors and other devices.

Also, even though silicon substrates present particular advantages for integration with ferroelectric elements, the invention can be applied to integration with other substrates, whether passive, such as glassy silicates, silica, or other ceramics, or other types of semiconductors, such as GaAs.

The invention thus provides ready electrical contacts to perovskite materials, especially ferroelectrics, and assures the reliability and lifetime of the resultant electrical element. It additionally acts as a barrier preventing the migration of deleterious elements in either direction through the electrode.

What is claimed is:

1. A ferroelectric capacitor, comprising:

a substrate;

a lower electrode formed on said substrate and including a conductive metal-oxide layer, said lower electrode forming a mesa over said substrate;

an insulating layer comprising a perovskite material overlying an outer peripheral portion of a top of said mesa, overlying the sides of said mesa, and overlying a portion of an upper surface of said substrate surrounding said mesa, an aperture through said insulating layer being formed in a center of said top of said mesa;

a ferroelectric layer formed over a portion of said electrode exposed in said aperture of said insulating layer and over portions of said insulating layer on said top of said mesa, on said sides of said mesa, and on at least part of said insulating layer overlying said portion of said upper surface of said substrate; and an upper electrode formed over said ferroelectric layer.

2. The ferroelectric capacitor of claim 1, wherein said perovskite material comprises a layered perovskite.

3. The ferroelectric capacitor of claim 2, wherein said perovskite material comprises bismuth titanate.

* * * * *